(12) United States Patent
Chen et al.

(10) Patent No.: US 9,331,638 B2
(45) Date of Patent: May 3, 2016

(54) DOHERTY POWER AMPLIFIER APPARATUS

(75) Inventors: Huazhang Chen, Shenzhen (CN); Jianli Liu, Shenzhen (CN); Jinyuan An, Shenzhen (CN); Xiaojun Cui, Shenzhen (CN)

(73) Assignee: ZTE Corproation, Shenzhen, Guangdong (CN)

(*) Notice: Subject to any disclaimer, the term of this patent is extended or adjusted under 35 U.S.C. 154(b) by 1000 days.

(21) Appl. No.: 13/514,696

(22) PCT Filed: Oct. 26, 2011

(86) PCT No.: PCT/CN2011/081344
§ 371 (c)(1),
(2), (4) Date: Jun. 8, 2012

(87) PCT Pub. No.: WO2012/146001
PCT Pub. Date: Nov. 1, 2012

(65) Prior Publication Data
US 2015/0349719 A1 Dec. 3, 2015

(30) Foreign Application Priority Data
Apr. 29, 2011 (CN) .......................... 2011 1 0111728

(51) Int. Cl.
*H03F 3/68* (2006.01)
*H03F 1/02* (2006.01)
(Continued)

(52) U.S. Cl.
CPC ............ *H03F 1/0288* (2013.01); *H03F 1/0261* (2013.01); *H03F 3/19* (2013.01);
(Continued)

(58) Field of Classification Search
CPC ........................................................ H03F 3/68
USPC ...................... 330/124 R, 295, 310
See application file for complete search history.

(56) References Cited

U.S. PATENT DOCUMENTS 7,362,170 B2 4/2008 Louis
2004/0108901 A1* 6/2004 Apel ...................... H03F 1/0244
330/285

(Continued)

FOREIGN PATENT DOCUMENTS

CN 1976217 A 6/2007
CN 102185563 A 9/2011
(Continued)

OTHER PUBLICATIONS

Extended European Search Report for EP 11842467.0, Completed by the European Patent Office, Dated Oct. 1, 2014, 7 Pages.
(Continued)

*Primary Examiner* — Patricia T Nguyen
(74) *Attorney, Agent, or Firm* — Brooks Kushman P.C.

(57) ABSTRACT

Disclosed is a Doherty power amplifier apparatus, including: a drive amplifier circuit, a power splitter circuit and a power combiner circuit, wherein the power splittercircuit is connected to the drive amplifier circuit, the apparatus further comprising: a carrier amplifier circuit and a peak amplifier circuit connected in parallel between the power splitter circuit and the power combiner circuit, wherein the carrier amplifier circuit comprises one or more parallel carrier amplification branches, wherein each carrier amplification branch comprises a multi-stage carrier amplifier apparatus, the multi-stage carrier amplifier apparatus is used for achieving multi-stage carrier amplification; and the peak amplifier circuit comprises one or more parallel peak amplification branches, wherein each peak amplification branch comprises a multi-stage peak amplifier apparatus, the multi-stage peak amplifier apparatus is used for achieving multi-stage peak amplification.

10 Claims, 3 Drawing Sheets

(51) Int. Cl.
*H03F 3/19* (2006.01)
*H03F 3/24* (2006.01)
*H03F 3/21* (2006.01)

(52) U.S. Cl.
CPC ............... *H03F 3/211* (2013.01); *H03F 3/245* (2013.01); *H03F 2200/15* (2013.01); *H03F 2200/18* (2013.01); *H03F 2200/405* (2013.01); *H03F 2200/447* (2013.01); *H03F 2200/451* (2013.01); *H03F 2203/21106* (2013.01)

(56) References Cited

U.S. PATENT DOCUMENTS

| 2007/0008032 | A1* | 1/2007 | Kyu | H03F 1/0288 330/51 |
|---|---|---|---|---|
| 2007/0298736 | A1* | 12/2007 | Fujioka | H03F 1/0266 455/127.3 |
| 2008/0122542 | A1* | 5/2008 | Bowles | H03F 1/0261 330/277 |
| 2008/0284509 | A1 | 11/2008 | Kim et al. | |
| 2011/0175677 | A1* | 7/2011 | Jeong | H03F 1/0288 330/124 R |
| 2014/0152389 | A1* | 6/2014 | Hamparian | H03F 3/211 330/295 |

FOREIGN PATENT DOCUMENTS

| JP | 2006333022 A | 12/2006 |
|---|---|---|
| WO | 0103289 | 1/2001 |

OTHER PUBLICATIONS

Gajadharsing et al. Microwave Symposium Digest, 2004 IEEE, vol. 2, p. 529-532, "Analysis and design of a 200W LDMOS based doherty amplifier for 3G base stations."

* cited by examiner

DOHERTY POWER AMPLIFIER APPARATUS

CROSS-REFERENCE TO RELATED APPLICATION

This application is the U.S. national phase of PCT Appln. No. PCT/CN2011/081344 filed Oct. 26, 2011 which claims priority to Chinese Application No. 201110111728.8 filed Apr. 29, 2011, the disclosures of which are incorporated in their entirety by reference herein.

TECHNICAL FIELD

The present invention relates to the communication field, and particularly, to a multi-stage Doherty power amplifier apparatus.

BACKGROUND OF THE RELATED ART

With the promotion of the concepts of greenery and low-carbon economy being popular in the world, the operators requires more and more to lower the power consumption of the wireless communication system. In the wireless communication system, the radio frequency power amplifier (abbreviated as power amplifier) in the base station device is one of the core modules of the whole system, and an important parameter of the radio frequency power amplifier is power amplifier efficiency. Data analysis indicates that in the whole base station device, the power consumption of the power amplifier portion occupies about 60% of the whole power consumption, thus, improving the efficiency of the power amplifier is the most effective means to reduce the power consumption of the base station device and reduce the operating expense (OPEX) of the operators. Therefore, in face of the increasingly fierce market competition of the wireless communication, high efficient radio frequency power amplifier technology has become one of the competition focal points of the wireless communication industries.

Doherty power amplifier is a high efficient power amplifier technology most widely applied currently in the wireless communication system, and it is invented by an American electronic engineer William H. Doherty in 1936. However, during the following about thirty years, people has switched their attention. Until the end of 1960s, with the development of the communication technology, especially satellite communication, the efficiency and linearity problems of the power amplifier are proposed again in a new history occasion, and the Doherty power amplifier is unearthed again and widely applied in the communication and broadcast system in 1970s. Until today, the combined application of Doherty power amplifier and digital pre-distortion (DPD) technology has become the mainstream architecture form of the high efficient power amplifier of the base station in the wireless communication system.

The principle of the conventional Doherty power amplifier is as shown in FIG. 1, and it mainly includes a power drive circuit (D1 . . . Dn in FIG. 1), a power splitter (S in FIG. 1), a carrier amplifier (C in FIG. 1, also referred to as main power amplifier), a peak amplifier (P in FIG. 1, also referred to as auxiliary power amplifier), and a power combiner it (C' in FIG. 1), etc. The basic concept of the conventional Doherty power amplifier is active load pull. The carrier amplifier works in class B or class AB, and the peak amplifier works in class C, and both of them undertake different input signal powers respectively and make the two power amplifiers work in their own saturation areas as far as possible, thus ensuring that the whole power amplifier maintains relatively high efficiency within a input signal power range which is as large as possible and at the same time ensuring a certain linearity.

Doherty power amplifier includes three working states: 1) small signal area, when the input signal is relatively small, the peak amplifier is in a cutoff state, the carrier amplifier works in class AB, and at this moment, the carrier amplifier works in the maximum efficiency match state; 2) load modulation area, when the input signal increases to a certain extent, the carrier amplifier gradually transits from the amplification area to the saturation area, the peak amplifier gradually transits from the cutoff area to the amplification area, the loads of these two amplifiers are instable, and the resistances of the loads change with the changes of the powers; and 3) saturation area, with the increasing of the input signal, the carrier amplifier and the peak amplifier finally work in the saturation state, both of them correspond to the load of 50Ω, and the output powers are added.

The conventional Doherty power amplifier has a relatively big disadvantage, i.e. due to the discretion of the input standing waves of the power amplifier device during the batch manufacture of the power amplifier, the consistency of the output of the power splitter (S in the figure) is affected, which will cause the mismatching when combining the output powers of the carrier amplification branch and peak amplification branch, thus lowering the efficiency and linear parameters of the whole power amplifier. Some manufacturers solve the above problem by adding a microwave adjustable capacitor in the input of the last-stage power amplifier, which not only increases the costs of the power amplifier but also greatly affects the manufacturability of large batch manufacture. The requirement by the operators on the communication system is lower power consumption and higher efficiency. Therefore, we have to seek for a method for further reducing power consumption and improving efficiency.

SUMMARY OF THE INVENTION

The object of the present invention is to provide a Doherty power amplifier apparatus so as to reduce the power consumption of the power amplifier and improve the efficiency of the power amplifier.

In order to solve the above problem, the present invention provides a Doherty power amplifier apparatus, comprising: a drive amplifier circuit, a power splitter and a power combiner, wherein the power splitter is connected to the drive amplifier circuit, the apparatus further comprising: a carrier amplifier circuit and a peak amplifier circuit connected in parallel between the power splitter and the power combiner, wherein the carrier amplifier circuit comprises one or more parallel carrier amplification branches, wherein each carrier amplification branch comprises a multi-stage carrier amplifier apparatus which is used for achieving multi-stage carrier amplification; and the peak amplifier circuit comprises one or more parallel peak amplification branches, wherein each peak amplification branch comprises a multi-stage peak amplifier apparatus wherein the multi-stage peak amplifier apparatus is used for achieving multi-stage peak amplification.

In the apparatus of the present invention, the multi-stage peak amplifier apparatus comprises a plurality of serial peak amplifiers.

In the apparatus of the present invention, the multi-stage carrier amplifier apparatus comprises a plurality of serial carrier amplifiers.

In the apparatus of the present invention, the multi-stage peak amplifier apparatus further comprises a power regulation apparatus connected to at least one of the plurality of peak amplifiers, wherein the power regulation apparatus is used for regulating the power of the peak amplifier.

In the apparatus of the present invention, the multi-stage carrier amplifier apparatus further comprises a power regulation apparatus connected to at least one of the plurality of carrier amplifiers, wherein the power regulation apparatus is used for regulating the power of the carrier amplifier.

In the apparatus of the present invention, the multi-stage peak amplifier apparatus is used for achieving N1-stage peak amplification, the M1-stage peak amplification of the multi-stage peak amplifier apparatus is implemented by an integrated circuit, and the remaining N1-M1-stage peak amplification is implemented by N1-M1 peak amplifiers.

In the apparatus of the present invention, the multi-stage carrier amplifier apparatus is used for achieving N2-stage carrier amplification, the M2-stage carrier amplification of the multi-stage carrier amplifier apparatus is implemented by an integrated circuit, and the remaining N2-M2-stage carrier amplification is implemented by N2-M2 carrier amplifiers.

In the apparatus of the present invention, the first M1-stage peak amplification, close to the power splitter, of the multi-stage peak amplifier apparatus is implemented by the integrated circuit.

In the apparatus of the present invention, the first M2-stage carrier amplification, close to the power splitter, of the multi-stage carrier amplifier apparatus is implemented by the integrated circuit.

In the apparatus of the present invention, the last stage peak amplification, close to the power combiner, of the multi-stage peak amplifier apparatus is implemented by the peak amplifier; and the last stage carrier amplification, close to the power combiner, of the multi-stage carrier amplifier apparatus is implemented by the carrier amplifier.

As compared to the related art, the present invention has the following advantages:

the consistency and manufacturability of batch manufacture of power amplifiers are good. Manufacture consistency is the biggest bottleneck restricting the batch delivery of the Doherty power amplifiers, currently, some manufacturers ensure large batch delivery at the cost of efficiency and linearity parameters or expensive costs, and in the present invention, this problem can be solved by regulating the power of the power amplifier with inventive zero cost.

The efficiency is high. The present invention solves the problem of reduced efficiency and linearity caused by the discretion of the input standing waves of the power amplifier during batch manufacture of the Doherty power amplifier and improves the batch efficiency of the power amplifier.

The costs are low. No additional devices are added, and as compared to the solution that some manufactures add microwave adjustable capacitors and even add complex radio frequency and digital circuits, the product cost and production cost of the power amplifier are greatly reduced.

The volume is small. All the drive stage circuits can be integrated into one piece of integrated circuit (IC), which greatly reduces the volume.

PREFERRED EMBODIMENTS OF THE PRESENT INVENTION

Figure 1:
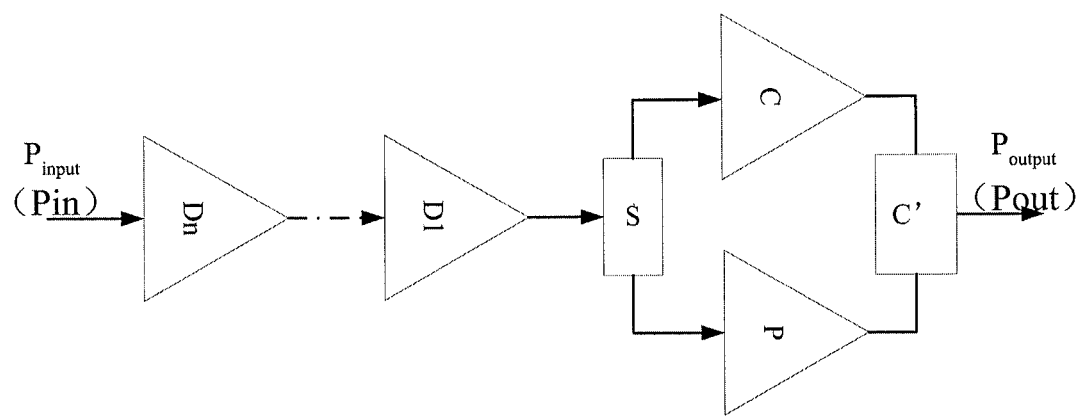
FIG. 1 is a block diagram of a conventional Doherty power amplifier.

In order to make the object, technical solution and advantages of the present invention more clear, the embodiments of the present invention will be further described in detail in conjunction with the accompanying drawings. It needs to note that the embodiments of the present application and the features in the embodiments can be combined with each other if there is no conflict.

The embodiments of the present invention designs the drive stage circuit into the carrier amplification branch and peak amplification branch so as to improve the efficiency of the drive stage, correspondingly improving the efficiency of the whole power amplifier; what is more important is that the multiplex drive stage circuit is implemented using IC, by way of changing the static offset voltage of the drive stage IC, the gains of a plurality of drive amplification branches can be regulated with in a large range, thus compensating the power distribution of the carrier amplification branch and peak amplification branch, effectively solving the problem of reduced efficiency and linearity caused by the discretion of the input standing waves of the power amplifier during batch manufacture of the Doherty power amplifier.

The embodiments of the present invention provides a Doherty power amplifier apparatus, comprising: a drive amplifier circuit, a power splitter and a power combiner, wherein the power splitter is connected to the drive amplifier circuit, the apparatus further comprising: a carrier amplifier circuit and a peak amplifier circuit connected in parallel between the power splitter and the power combiner, wherein the carrier amplifier circuit comprises one or more parallel carrier amplification branches, wherein each carrier amplification branch comprises a multi-stage carrier amplifier apparatus, and the multi-stage carrier amplifier apparatus is used for achieving multi-stage carrier amplification; and the peak amplifier circuit comprises one or more parallel peak amplification branches, wherein each peak amplification branch comprises a multi-stage peak amplifier apparatus, and the multi-stage peak amplifier apparatus is used for achieving multi-stage peak amplification.

In this embodiment, the multi-stage peak amplifier apparatus comprises a plurality of serial peak amplifiers. The multi-stage carrier amplifier apparatus includes a plurality of serial carrier amplifiers.

In this embodiment, the multi-stage peak amplifier apparatus further comprises a power regulation apparatus connected to at least one of the plurality of peak amplifiers, wherein the power regulation apparatus is used for regulating the power of the peak amplifier.

In this embodiment, the multi-stage carrier amplifier apparatus further comprises a power regulation apparatus connected to at least one of the plurality of carrier amplifiers, wherein the power regulation apparatus is used for regulating the power of the carrier amplifier.

The function of the power regulation apparatus is to regulate the powers of the peak amplifier and carrier amplifier and make the outputs of the carrier amplifier and peak amplifier match. In this case, a power regulation apparatus can be configured for some of or all of the multi-stage peak amplifiers and carrier amplifiers, which can be configured particularly as required.

In this embodiment, the multi-stage peak amplifier apparatus and multi-stage carrier amplifier apparatus can achieve one stage or multi-stage peak amplification and carrier amplification using an integrated circuit. It can be implemented using one or more integrated circuit chips.

For example, the multi-stage peak amplifier apparatus is used for achieving N1-stage peak amplification, the M1-stage peak amplification of the multi-stage peak amplifier apparatus is implemented by an integrated circuit, and the remaining N1-M1-stage peak amplification is implemented by N1-M1 peak amplifiers. The multi-stage carrier amplifier apparatus is used for achieving N2-stage carrier amplification, the M2-stage carrier amplification of the multi-stage carrier amplifier apparatus is implemented by an integrated circuit, and the remaining N2-M2-stage carrier amplification is implemented by N2-M2 carrier amplifiers.

In this embodiment, the first M1-stage peak amplification, close to the power splitter, of the multi-stage peak amplifier apparatus is implemented by the integrated circuit. In this case, the first M2-stage carrier amplification, close to the power splitter, of the multi-stage carrier amplifier apparatus is implemented by the integrated circuit. Of course, it can be that the M1-stage peak amplification in the middle of N1-stage peak amplification is implemented by the integrated circuit, and the M2-stage peak amplification in the middle of N2-stage peak amplification is implemented by the integrated circuit.

Regarding the power of the integrated circuit, when the power of the integrated circuit cannot meet the practical requirements, the last stage peak amplification, close to the power combiner, of the multi-stage peak amplifier apparatus is usually implemented by the peak amplifier; and the last stage peak amplification, close to the power combiner, of the multi-stage carrier amplifier apparatus is implemented by the carrier amplifier.

The number of stages of the multi-stage carrier amplifier apparatus can be the same as or different from the number of stages of the multi-stage peak amplifier apparatus.

Hereinafter, the present invention will be further descried by way of particular embodiments.

Embodiment 1

Figure 2:
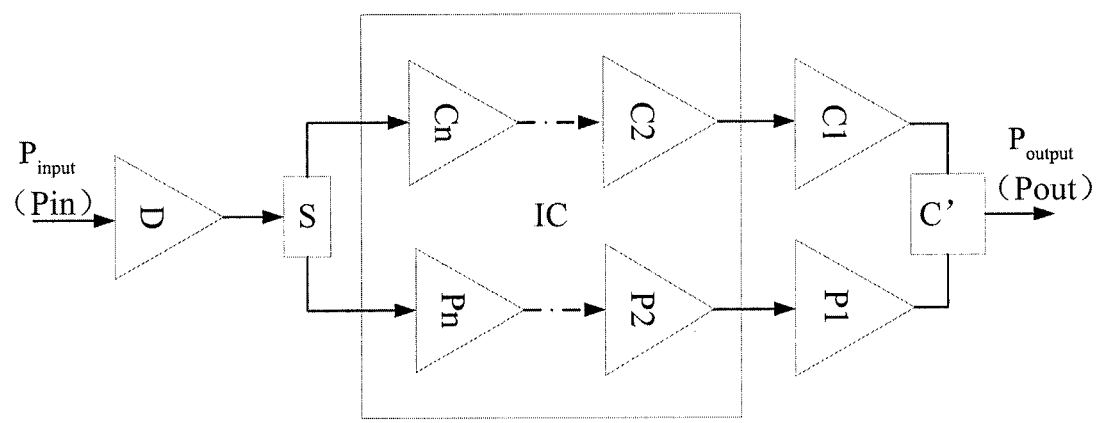
FIG. 2 is a block diagram of the principle of a duplex Doherty architecture according to the embodiments of the present invention.

The technical solution of the present invention applied in a duplex Doherty architecture is as shown in FIG. 2. In FIG. 2, Pin is the input signal port, D is the drive amplifier circuit, S is the power splitter, C1 to Cn form a carrier amplification branch of a multi-stage Doherty power amplifier, P1 to Pn form a peak amplification branch of the multi-stage Doherty power amplifier, and C' is the power combiner.

When the input signal is small, the whole peak amplification branch is in the cutoff state, and the whole carrier amplification branch works in class AB matching the maximum efficiency; when the input signal increases to a certain extent, the carrier amplification branch gradually transits from the amplification area to the saturation area, and the peak amplification branch gradually transits from the cutoff area to the amplification area; and with the increasing of the input signal, the whole carrier amplification branch and peak amplification branch finally work in the saturation state.

In FIG. 2, C1 to Cn and P1 to Pn can be directly achieved by using peak amplifiers and carrier amplifiers connected serially, and a power regulation apparatus is configured for one or more peak amplifiers and carrier amplifiers in C1 to Cn and P1 to Pn, and the multi-stage peak amplification and carrier amplification can be implemented using a chip. C2 to Cn and P2 to Pn can be implemented by one piece of IC, C1 is implemented by a carrier amplifier, and P1 is implemented by a peak amplifier. Of course, C2 to Cn can be implemented by one piece of IC, and P2 to Pn can be implemented by one piece of IC. $C_{n1}$ to $C_{n2}$ can be implemented by an IC chip, the remaining are implemented by the peak amplifier, wherein n1 is greater than or equal to 1, n2 is less than or equal to n, and P1 to Pn are similar. If the power of the IC chip meets the practical requirements, all of C1 to Cn and P1 to Pn can be implemented by the IC chip.

As compared to the class AB power amplifier, the conventional single stage Doherty power amplifier improves the efficiency of the last-stage amplifier, the present invention not only employs the multi-stage Doherty power amplifier but also improves the efficiency of the drive stage power amplifier as well as regulates the power distribution of 2 branches within a large range by inventively changing the static offset voltage ($V_{GS}$s of C2 to Cn and P2 to Pn) of the drive stage IC, which, without increasing the cost, solves the problem of reduced efficiency and linearity caused by the discretion of the input standing waves of the power amplifier during batch manufacture of the Doherty power amplifier and improves the batch efficiency of the power amplifier.

Embodiment 2

Figure 3:
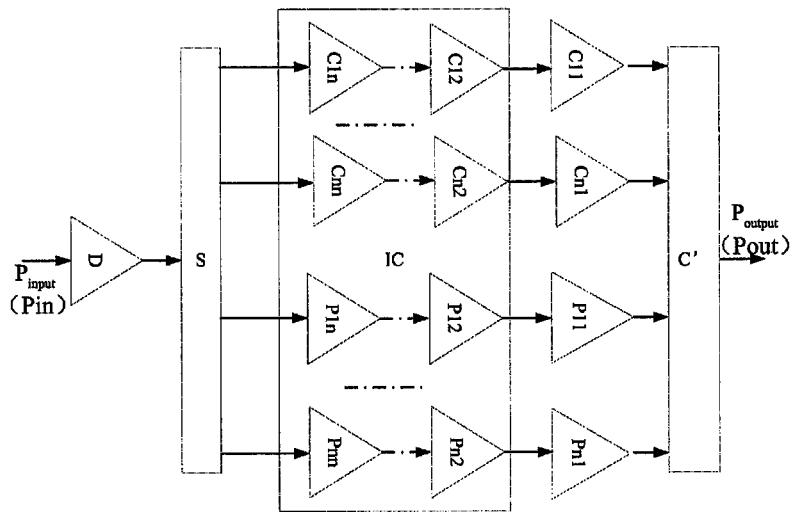
FIG. 3 is a block diagram of the principle of a multiplex Doherty architecture according to the embodiments of the present invention.

The technical solution of the present invention applied in a multiplex Doherty architecture is as shown in FIG. 3. In the figure, Pin is the input signal port, D is the drive amplifier circuit, S is the power splitter, C11 ... C1n and Cn1 ... Cnn form the first to the $n^{th}$ carrier amplification branches of a multi-stage Doherty power amplifier, P11 ... P1n and Pn1 ... Pnn form the first to the $n^{th}$ peak amplification branch of the multi-stage Doherty power amplifier, and C' is the power combiner. The principle of improving its performance is similar to that of duplex multi-stage Doherty architecture.

All the drive stage amplifiers in the present invention can be designed into one piece of IC (integrated circuit), and embody excellent advantages regarding the aspects such as performance index and manufacturability of the power amplifier.

Hereinafter, the embodiments applying the power amplifier of the present invention will be set forth.

The main technical requirements of the power amplifier of a certain universal mobile telecommunications system (UMTS) are as follows: frequency range from 2110 MHz to 2170 MHz, output power 85 W, input signal PAR 7 dB, gain 50 dB, efficiency 42%, linearity parameters (Adjacent Channel Power Ratio (ACPR), Spectrum emission mask (SEM) Out of Band Spurious, etc.), meet the requirements of the standard protocol.

The process of completing the development of the whole power amplifier by applying the present invention mainly includes the following steps:

in step A, the architecture form of the power amplifier is determined. Since the output power of the present power amplifier is 85 W, the efficiency requirement is above 42%, it is decided to employ the duplex multi-stage Doherty architecture form (such as the architecture in FIG. 2) for the whole power amplifier by comprehensively taking the technical index requirements of the power amplifier and the conditions of the existing devices into account.

In step B, the model numbers of the end stage carrier amplification (C1) and end stage peak amplification (P1) power amplifier tube are selected. The LDMOS power amplifier device BLF7G20LS-200 of the NXP cooperation is selected as the last-stage carrier and peak amplifiers according to the output power and input signal PAR (Peak-to-Average Ratio) requirements.

Figure 4:
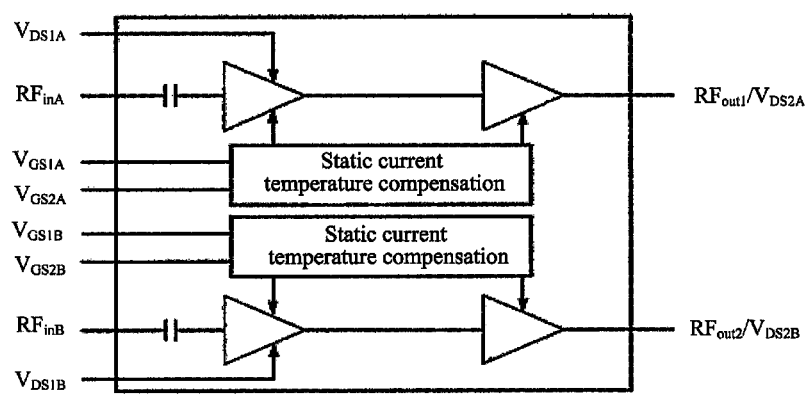
FIG. 4 is a functional block diagram of a drive stage IC MD7IC2250.

In step C, an IC device is selected. Considering the requirements of each aspect, the MD71C2250 of Freescale cooperation is selected as the drive IC device. The function block diagram of this IC is as shown in FIG. 4. The internal part is composed of 2 amplifier circuits, and each amplifier circuit is composed of 2 stages, its gain can be changed by regulating the static offset voltage (i.e. gate offset voltage, $V_{GS1A}$, $V_{GS2A}$, $V_{GS1B}$, $V_{GS1B}$) of each stage amplifier, thus achieving the object of flexibly regulating the output powers of 2 branches within a large range.

In step D, the remaining circuit devices such as drive amplifier circuit (D), temperature compensation, circulator, etc. are selected.

In step E, the design of principle diagram and PCB of the whole power amplifier is completed.

In step F, the debugging and test for the whole power amplifier are completed.

Figure 5:
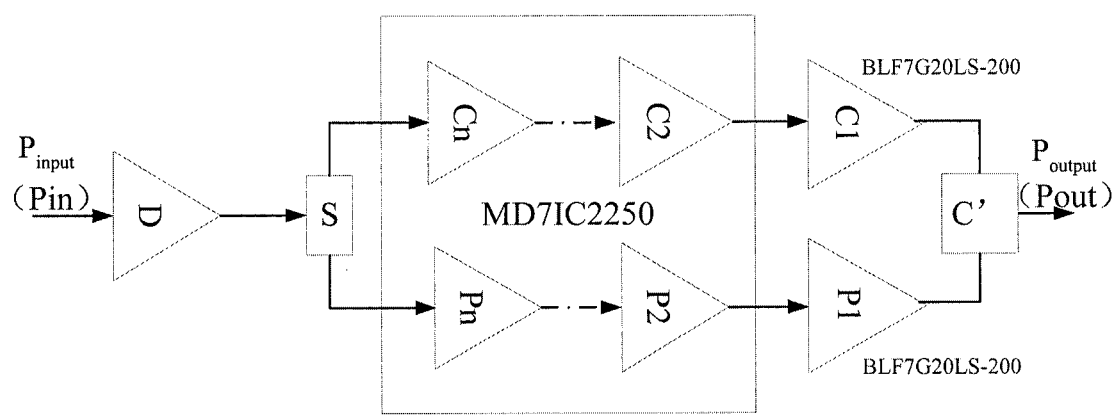
FIG. 5 is an embodiment of a UMTS 2.1 GHz frequency band 85 W power amplifier according to the present invention.

The UMTS 2.1 GHz band 85 W power amplifier designed by using the present invention is as shown in FIG. 5. The implementation is simple, the design and debugging are convenient and flexible, the costs are low, the technical indices are good, and the manufacturability is good.

Obviously, those skilled in the art should understand that the above modules or steps of the present invention can be implemented using a general-purpose computing apparatus, and they can be integrated on a single computing apparatus or distributed over a network composed of multiple computing devices; optionally, they can be implemented using computing apparatus executable program codes, thus, they can be stored in a storage apparatus for being executed by the computing apparatus, or they can be made into various integrated circuit modules respectively, or some modules or steps therein are made into a single integrated circuit module for implementation. In this way, the present invention is not limited to any particular combination of hardware and software.

The forgoing is merely examples of preferred particular embodiments of the present invention, and the present apparatus can be widely applied in the design of various Doherty power amplifiers. However, the scope of protection of the present invention is not limited to this; those changes or alternatives which can easily occur to those skilled in the art within the technical scoped disclosed in the present invention shall fall within the scope of protection of the present invention. The scope of protection of the present invention shall be based on the scope of protection of the claims.

INDUSTRIAL APPLICABILITY

The consistency and manufacturability of the batch manufacture of the power amplifier in the present invention are good, the present invention solves this problem by regulating the power of the power amplifier with inventive zero costs; the present invention improves the batch efficiency of the power amplifier; as compared to the solution that some manufactures add microwave adjustable capacitors and even add complex radio frequency and digital circuit, the production cost and production cost of the power amplifier are greatly reduced in the present invention without adding any additional devices; and the volume is greatly reduced with the present invention.

What we claim is:

1. A Doherty power amplifier apparatus, comprising: a drive amplifier circuit, a power splitter, a carrier amplifier circuit, a peak amplifier circuit and a power combiner, one end of the power splitter connected to the drive amplifier circuit, the carrier amplifier circuit and the peak amplifier circuit connected in parallel between the other end of the power splitter and the power combiner, wherein, the carrier amplifier circuit comprises one or more parallel carrier amplification branches, each carrier amplification branch comprises a multi-stage carrier amplifier apparatus, and the multi-stage carrier amplifier apparatus is used for achieving multi-stage carrier amplification; and the peak amplifier circuit comprises one or more parallel peak amplification branches, each peak amplification branch comprises a multi-stage peak amplifier apparatus, and the multi-stage peak amplifier apparatus is used for achieving multi-stage peak amplification;

wherein, the multi-stage peak amplifier apparatus comprises N1 serial peak amplifiers in which M1 serial peak amplifiers are integrated into a first integrated circuit, where M1 and N1 are integers, N1>2 and 1<M1<N1, and wherein, the multi-stage carrier amplifier apparatus comprises N2 serial carrier amplifiers in which M2 serial carrier amplifiers are integrated into a second integrated circuit, where M2 and N2 are integers, N2>2 and 1<M2<N2;

a power distribution of the peak amplification branch(es) and the carrier amplification branch(es) is regulated within a large range by changing a static offset voltage of the first integrated circuit and/or the second integrated circuit to solve a problem of reduced efficiency and linearity caused by the discretion of the input standing waves of the power amplifier during batch manufacture of the Doherty power amplifier.

2. The apparatus as claimed in claim 1, wherein the multi-stage peak amplifier apparatus further comprises a power regulation apparatus connected to at least one of the (N1-M1) peak amplifiers, and the power regulation apparatus is used for regulating a power of the corresponding peak amplifier.

3. The apparatus as claimed in claim 1, wherein the multi-stage carrier amplifier apparatus further comprises a power regulation apparatus connected to at least one of the (N2-M2) carrier amplifiers, and the power regulation apparatus is used for regulating a power of the corresponding carrier amplifier.

4. The apparatus as claimed in claim 1, wherein first M1 serial peak amplifiers, which are close to the power splitter, of the multi-stage peak amplifier apparatus are implemented by the first integrated circuit.

5. The apparatus as claimed in claim 1, wherein first M2 serial carrier amplifiers, which are close to the power splitter, of the multi-stage carrier amplifier apparatus are implemented by the second integrated circuit.

6. The apparatus as claimed in claim 1, wherein the last one peak amplifier, which is close to the power combiner, of the multi-stage peak amplifier apparatus is implemented by one peak amplifier.

7. The apparatus as claimed in claim 4, wherein the last one peak amplifier, which is close to the power combiner, of the multi-stage peak amplifier apparatus is implemented by one peak amplifier.

8. The apparatus as claimed in claim 1, wherein the last one carrier amplifier, which is close to the power combiner, of the multi-stage carrier amplifier apparatus is implemented by one carrier amplifier.

9. The apparatus as claimed in claim 5, wherein the last one carrier amplifier, which is close to the power combiner, of the multi-stage carrier amplifier apparatus is implemented by one carrier amplifier.

10. The apparatus as claimed in claim 1, wherein the first integrated circuit and the second integrated circuit are implemented on one integrated circuit chip.

\* \* \* \* \*